United States Patent
Lee et al.

(10) Patent No.: US 7,026,711 B2
(45) Date of Patent: Apr. 11, 2006

(54) THERMAL DISPENSING ENHANCEMENT FOR HIGH PERFORMANCE FLIP CHIP BGA (HPFCBGA)

(75) Inventors: Daniel Lee, Kaohsiung (TW); Chender Huang, Hsin-Chu (TW); Chien-Hsiun Lee, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 10/737,496

(22) Filed: Dec. 16, 2003

(65) Prior Publication Data

US 2005/0127502 A1   Jun. 16, 2005

(51) Int. Cl.
H01L 23/10 (2006.01)
H01L 23/12 (2006.01)
H01L 23/48 (2006.01)
H01L 23/52 (2006.01)

(52) U.S. Cl. .............. 257/706; 257/704; 257/713; 257/778; 257/780; 257/723

(58) Field of Classification Search .......... 257/706, 257/704, 713, 780, 778, 723
See application file for complete search history.

(56) References Cited

U.S. PATENT DOCUMENTS

| | | | |
|---|---|---|---|
| 5,909,057 A | 6/1999 | McCormick et al. | |
| 6,011,304 A * | 1/2000 | Mertol | 257/706 |
| 6,084,297 A * | 7/2000 | Brooks et al. | 257/698 |
| 6,162,659 A * | 12/2000 | Wu | 438/106 |
| 6,300,250 B1 | 10/2001 | Tsai | |
| 6,391,683 B1 | 5/2002 | Chiu et al. | |
| 6,404,048 B1 * | 6/2002 | Akram | 257/706 |
| 6,479,903 B1 | 11/2002 | Briar | |
| 6,506,626 B1 | 1/2003 | Chiu | |
| 6,515,870 B1 * | 2/2003 | Skinner et al. | 361/800 |
| 6,534,859 B1 | 3/2003 | Shim et al. | |
| 6,544,813 B1 | 4/2003 | Lin | |
| 6,551,861 B1 | 4/2003 | Lin | |
| 6,576,484 B1 | 6/2003 | Birdsley et al. | |
| 6,580,167 B1 * | 6/2003 | Glenn et al. | 257/718 |
| 6,649,937 B1 * | 11/2003 | Searls et al. | 257/77 |
| 2003/0020151 A1 | 1/2003 | Chen et al. | |
| 2003/0183909 A1 * | 10/2003 | Chiu | 257/667 |
| 2004/0253801 A1 * | 12/2004 | Lin | 438/612 |

* cited by examiner

Primary Examiner—Nitin Parekh
(74) Attorney, Agent, or Firm—Haynes and Boone, LLP

(57) ABSTRACT

A microelectronic package comprising a device substrate having first and second opposing surfaces and comprising a plurality of microelectronic devices. The microelectronic package also includes a plurality of electrically conductive members coupled to corresponding ones of the plurality of microelectronics device and extending away from the first surface. A thermally conductive layer is located on the second surface of the device substrate, and a package substrate is coupled to the device substrate, the package substrate having a plurality of electrically conductive traces coupled to corresponding ones of the plurality of electrically conductive members.

15 Claims, 1 Drawing Sheet

THERMAL DISPENSING ENHANCEMENT FOR HIGH PERFORMANCE FLIP CHIP BGA (HPFCBGA)

BACKGROUND

The present disclosure relates generally to microelectronics packaging and, more specifically, to thermal dispensing enhancement for microelectronics packages.

Thermal stress induced through thermal cycling of microelectronic devices during ball grid array (BGA) and flip chip attachment processes can be deleterious to product yield, performance and reliability of resulting microelectronics device packages. For example, thermal cycling can exacerbate diffusion of dopants and/or metal employed as interconnect material. Thermal cycling can also induce stress in substrates within the packages, which can cause delamination and cracking, possibly leading to catastrophic failures.

Accordingly, what is needed in the art is a device and method of manufacture thereof that addresses the above-discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
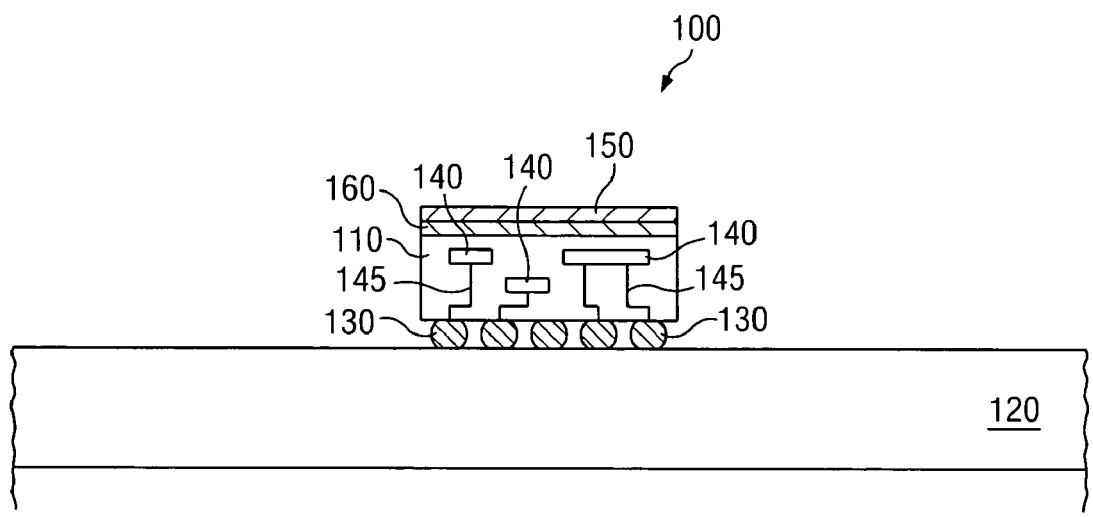
FIG. 1 illustrates a sectional view of one embodiment of a microelectronic package constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of one embodiment of a microelectronic package 100 constructed according to aspects of the present disclosure. The microelectronic package 100 includes a device substrate 110 coupled to a package substrate 120. Although any means for coupling the device and package substrates 110, 120 are within the scope of the present disclosure, a ball grid array 130 is employed to couple the substrates in the illustrated embodiment. The ball grid array (BGA) 130 includes a plurality of solder bump balls or other electrically conductive members that may have a substantially spherical shape, at least prior to a reflow process employed to couple the substrates 110, 120 via the BGA 130.

The device substrate 110 may comprise one or more microelectronic devices 140, such as transistors, electrically programmable read only memory (EPROM) cells, electrically erasable programmable read only memory (EEPROM) cells, static random access memory (SRAM) cells, dynamic random access memory (DRAM) cells and other microelectronic devices, which may be interconnected to form one or more integrated circuits. The microelectronic devices 140 are schematically depicted in FIG. 1 because the device substrate 110 contemplates one or more substrates on or in which one or more conventional or future-developed microelectronic devices may be formed. The device substrate 110 also includes interconnects 145 electrically connecting the microelectronic devices 140 and corresponding ones of the electrical conductors of the BGA 130.

The package substrate 120 may be a printed circuit board (PCB), a multiple chip package substrate or other types of substrates. The package substrate 120 may also include a ball grid array coupled thereto on a surface opposite the device substrate 110. The bulk of the device substrate 110 and/or the package substrate 120 may be a silicon-on-insulator (SOI) substrate and/or may comprise silicon, gallium arsenide, strained silicon, silicon germanium, carbide, diamond and other materials.

The microelectronic package 100 also includes a thermally conductive layer 150 formed on the device substrate 110 opposite the package substrate 120. The thermally conductive layer 150 may comprise one or more layers of a solid and/or rigid thermally conductive material. In one embodiment, the thermally conductive material has a thermal conductivity ranging between about 140 W/m° K and about 500 W/m° K. For example silicon may be employed as the thermally conductive layer because it has a thermal conductivity of about 147 W/m° K. Copper may also or alternatively be employed as the thermally conductive layer 150 because it has a thermal conductivity of about 400 W/m° K.

The thermally conductive layer 150 may also comprise silver, gold, aluminum or materials or alloys having relatively high thermal conductivities. In one embodiment, the thermally conductive layer 150 may be deposited by chemical-vapor deposition (CVD), plasma enhanced CVD (PECVD), atomic layer deposition (ALD), physical vapor deposition (PVD), electroplating, evaporation, sputtering and/or other processes, possibly to a thickness ranging between about 500 Angstroms and about 5000 Angstroms. The thermally conductive layer 150 may also be formed on the device substrate 110 prior to a dicing operation performed to separate the device substrate 110 from the wafer on which it is formed. That is, multiple device substrates 110 may be simulatenously fabricated on a single wafer (or a batch of wafers), wherein a substantial portion of the "backside" of the wafer may be coated with the thermally conductive layer 150 prior to separating the wafer into individual dies each comprising one or more device substrates 110.

Forming the thermally conductive layer 150 on the device substrate 110 also contemplates forming one or more additional layers interposing the thermally conductive layer 150 and the device substrate 110. For example, a seed layer 160 may be formed on the device substrate 110 prior to forming the thermally conductive layer 150. The seed layer 160 may be a thin, thermally conductive layer that permits or encourages the adhesion of the subsequently deposited thermally conductive layer 150. The seed layer 160 may comprise a refractory metal such as Ti, Ta, TiN, TaN, WN, TiW, Ni, Cr and/or other materials, and may be formed by CVD, PECVD, ALD, PVD, electroplating, evaporation, sputtering and/or other processes. The seed layer 160 may have a thickness ranging between about 5 Angstroms and about 1000 Angstroms. However, other thicknesses, materials and fabrication methods may be employed to form the seed layer 160 within the scope of the present disclosure. Moreover, in some embodiments, the conductive layer 150 may be adhered directly to the device substrate 110 without an interposing seed layer 160, or another type of layer may interpose the device substrate 110 and the thermally conductive layer 150 in addition to or instead of the seed layer 160.

Figure 2:
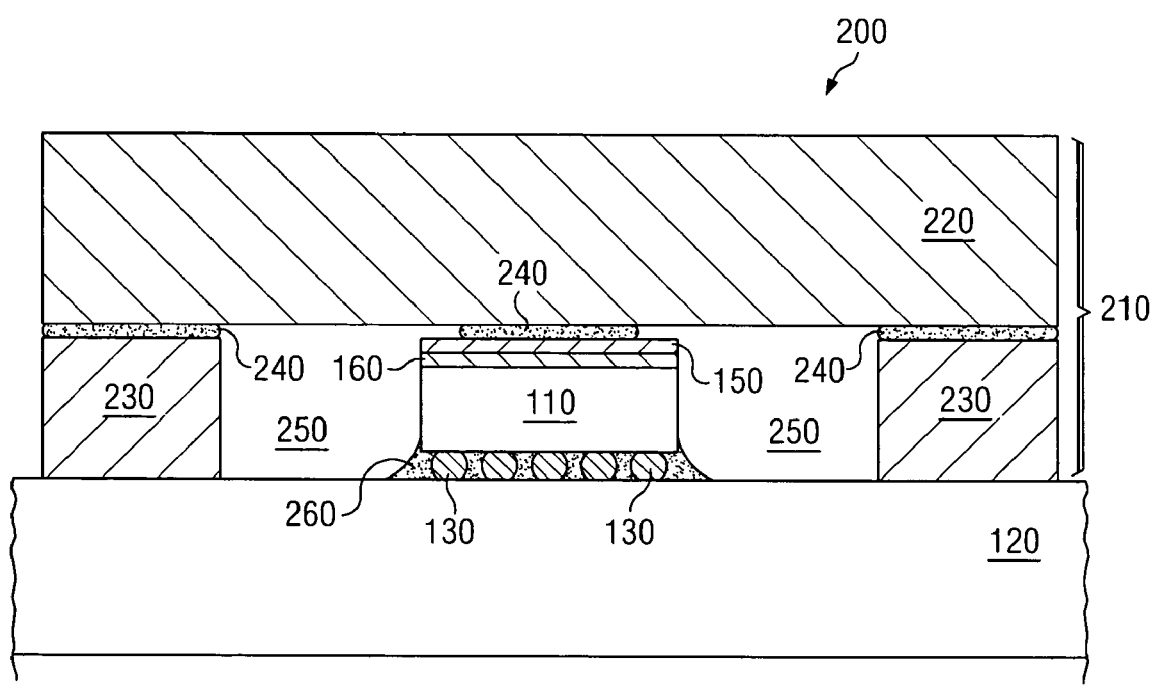
FIG. 2 illustrates a sectional view of another embodiment of a microelectronic package constructed according to aspects of the present disclosure.

Referring to FIG. 2, illustrated is a sectional view of another embodiment of the microelectronic package 100 shown in FIG. 1, designated herein by reference numeral 200. The microelectronic package 200 includes the device substrate 110, the package substrate 120, the BGA 130, the thermally conductive layer 150 and the seed layer 160 shown in FIG. 1. However, the microelectronic package 200 further includes a heat dissipation assembly (HDA) 210. The HDA 210 includes a spreader 220 and one or more stiffeners 230.

The spreader 220 and the stiffeners 230 may be formed integrally or employed as discrete elements, and may substantially comprise materials having relatively high thermal conductivities. For example, the thermal conductivity of each of the spreader 220 and the stiffeners 230 may range between about 140 W/m° K and about 500 W/m° K. In one embodiment, the spreader 220 and the stiffener 230 may comprise aluminum, stainless steel, copper, nickel and/or nickel-plated copper. Of course, the spreader 220 and the stiffener 230 may comprise other materials, and may also comprise different materials. For example, the spreader 220 may substantially comprise an aluminum-copper alloy, whereas the stiffener 230 may substantially comprise a nickel-copper alloy. However, in one embodiment, the spreader 220, the stiffener 230 and the thermally conductive layer 150 may have substantially similar thermal conductivities, possibly due to substantial similarities of the compositions selected for each element.

The stiffener 230 may have a thickness substantially similar to the aggregate thickness of the BGA 130, the device substrate 110, the seed layer 160 and the thermally conductive layer 150, as shown in FIG. 2. Accordingly, the spreader 220 may be a substantially planar element that provides substantial surface area for thermally efficient surface contact with the thermally conductive layer 150 and the stiffeners 230.

In one embodiment, as illustrated in FIG. 2, the HDA 210 may also include thermal adhesive 240. The thermal adhesive may be disposed between the spreader 220 and the stiffeners 230, or between the spreader 220 and the thermally conductive layer 150, or both. The thermal adhesive 240 may comprise a viscous gel or liquid material, such as thermal grease, silver paste or solder. The thermal adhesive 240 may be applied in the form of a thin layer applied by mechanical layer spreading. Alternatively, the thermal adhesive 240 layer may be applied by capillary action.

In one embodiment, the spreader 220 has substantially similar dimensions as the package substrate 120, although in other embodiments the spreader 220 may be substantially smaller than the package substrate 120. In either case, the spreader 220 may be sized to substantially cover and enclose the device substrate 110 in conjunction with the stiffeners 230. Accordingly, the spreader 220 and the stiffeners 230 may define a cavity 250 within which the device substrate 110 is coupled to the package substrate 120. In one embodiment, the cavity 250 may be substantially filled with a thermo-set epoxy or other backfill material 260. In another embodiment, as shown in FIG. 2, the backfill material 260 may only be disposed in a region proximate the device substrate 110 and separated from the stiffeners 230. In either embodiment, the backfill material 260 may interpose the electrically conductive members of the BGA 130. The backfill material 260 may be deposited around the device substrate 110 and between the device substrate 110 and the package substrate 120 before the spreader 220 is assembled to the stiffeners 230. In another embodiment, the backfill material is deposited by injection through apertures in the spreader 220 and/or the stiffeners 230 or between the stiffeners 230 and the package substrate 120.

Thus, the present disclosure provides, in one embodiment, a microelectronic package comprising a device substrate having first and second opposing surfaces and comprising a plurality of microelectronic devices. The microelectronic package may also include a plurality of electrically conductive members coupled to corresponding ones of the plurality of microelectronics device and extending away from the first surface. A thermally conductive layer is located on the second surface of the device substrate, and a package substrate is coupled to the device substrate, the package substrate having a plurality of electrically conductive traces coupled to corresponding ones of the plurality of electrically conductive members.

A microelectronic device is also introduced in the present disclosure, the device having a substrate and a plurality of interconnected devices located in the substrate, wherein ones of the interconnected devices have electrically conductive members extending to a first surface of the substrate. The device also includes a rigid, thermally conductive layer located on a second surface of the device substrate.

The present disclosure also provides a method of manufacturing a microelectronic package comprising, in one embodiment, providing a device substrate having: (1) first and second opposing surfaces; (2) a plurality of microelectronic devices; and (3) a plurality of electrically conductive members coupled to corresponding ones of the plurality of microelectronic device and extending away from the first surface. The method further includes forming a rigid, thermally conductive layer on the second surface. A package substrate is subsequently coupled to the device substrate, thereby coupling a plurality of electrically conductive traces on the package substrate to corresponding ones of the plurality of electrically conductive members.

Another embodiment of a method of manufacturing a microelectronic package according to aspects of the present disclosure comprises providing a device substrate having: (1) first and second opposing surfaces; (2) a plurality of interconnected microelectronic devices; (3) a plurality of electrically conductive members each extending from a corresponding one of the plurality of interconnect microelectronic devices to the first surface; and (4) a thermally conductive layer located adjacent the second surface. The method also includes providing a package substrate having a plurality of electrically conductive traces extending to a package substrate surface. The package substrate is coupled to the device substrate, thereby coupling ones of the plurality of electrically conductive traces to corresponding ones of the plurality of electrically conductive members.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
   a device substrate having first and second opposing surfaces, the device substrate comprising a plurality of microelectronic devices;
   a plurality of electrically conductive members coupled to corresponding ones of the plurality of microelectronics device and extending away from the first surface;
   a package substrate coupled to the device substrate and having a plurality of electrically conductive traces coupled to corresponding ones of the plurality of electrically conductive members;
   a spreader substantially comprising an aluminum-copper alloy;
   at least one first thermally conductive layer interposing the second surface of the device substrate and the spreader and including:
      a substantially solid layer substantially comprising copper or an aluminum-copper alloy;
      a thermally conductive adhesive layer contacting the second surface of the device substrate and the substantially solid layer, wherein the thermally conductive adhesive layer substantially comprises a refractory metal; and
      a thermal adhesive layer contacting the spreader and the substantially solid layer and having one of a substantially viscous gel composition and a liquid composition;
   at least one stiffener interposing the spreader and the package substrate and substantially comprising a nickel-copper alloy; and
   at least one second thermally conductive layer interposing the stiffener and the spreader.

2. The apparatus of claim 1 wherein the plurality of electrically conductive members, the device substrate, and the at least one first thermally conductive layer collectively establish a separation distance between the spreader and the package substrate, and wherein the at least one stiffener and the at least one second thermally conductive layer collectively span the separation distance.

3. The apparatus of claim 1 wherein the at least one stiffener substantially encircles the device substrate.

4. The apparatus of claim 1 wherein the at least one stiffener, the spreader, and the package substrate, collectively, substantially enclose the device substrate.

5. The apparatus of claim 1 wherein the at least one stiffener, the spreader, and the package substrate, collectively, define a cavity substantially enclosing the device substrate, wherein the cavity is substantially filled with a backfill material.

6. The apparatus of claim 1 wherein the at least one stiffener, the spreader, and package substrate, collectively, define a cavity substantially enclosing the device substrate, wherein the cavity is substantially filled with a thermo-set epoxy.

7. The apparatus of claim 1 wherein the at least one stiffener comprises more than one stiffener.

8. The apparatus of claim 1 wherein the spreader and the at least one stiffener each have a thermal conductivity greater than about 140 W/m° K.

9. The apparatus of claim 1 wherein the spreader and the at least one stiffener each have a thermal conductivity ranging between about 140 W/m° K and about 500 W/m° K.

10. The apparatus of claim 1 wherein a collective thickness of the at least one second thermally conductive layer and the at least one stiffener is configured to permit thermal energy conduction between the spreader and the package substrate through the at least one second thermally conductive layer and the at least one stiffener.

11. The apparatus of claim 1 wherein the device substrate comprises diamond.

12. The apparatus of claim 1 wherein ones of the plurality of electrically conductive members are collectively a ball grid array.

13. The apparatus of claim 1 wherein the spreader and the package substrate have substantially similar dimensions.

14. An apparatus, comprising:
   a device substrate having first and second opposing surfaces, the device substrate comprising a plurality of microelectronic devices;
   a plurality of electrically conductive members coupled to corresponding ones of the plurality of microelectronics device and extending away from the first surface;
   a package substrate coupled to the device substrate and having a plurality of electrically conductive traces coupled to corresponding ones of the plurality of electrically conductive members;
   a heat dissipation spreader and at least one heat dissipation stiffener interposing the heat dissipation spreader and the package substrate, wherein the at least one heat dissipation stiffener contacts the package substrate, such that the heat dissipation spreader, the at least one heat dissipation stiffener, and the package substrate, collectively, substantially enclose the device substrate, wherein the heat dissipation spreader substantially comprises an aluminum-copper alloy and the at least one heat dissipation stiffener substantially comprises a nickel-copper alloy; and
   at least one thermally conductive layer interposing the second surface of the device substrate and the heat dissipation spreader and including:
      a substantially solid layer substantially comprising copper or an aluminum-copper alloy;
      a thermally conductive adhesive layer contacting the second surface of the device substrate and the substantially solid layer, wherein the thermally conductive adhesive layer substantially comprises a refractory metal; and
      a thermal adhesive layer contacting the spreader and the substantially solid layer and having one of a substantially viscous gel composition and a liquid composition.

15. The apparatus of claim 14 wherein the heat dissipation spreader, the at least one heat dissipation stiffener, and the at least one first thermally conductive layer each have a thermal conductivity ranging between about 140 W/m–° K and about 500 W/m–° K.

* * * * *